United States Patent
Takahashi

(10) Patent No.: US 9,887,670 B2
(45) Date of Patent: Feb. 6, 2018

(54) POWER SUPPLY CIRCUIT, HIGH-FREQUENCY POWER AMPLIFICATION CIRCUIT, AND POWER SUPPLY CONTROL METHOD

(71) Applicant: NEC CORPORATION, Tokyo (JP)

(72) Inventor: Kiyohiko Takahashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/028,556

(22) PCT Filed: May 9, 2014

(86) PCT No.: PCT/JP2014/002464
§ 371 (c)(1),
(2) Date: Apr. 11, 2016

(87) PCT Pub. No.: WO2015/056366
PCT Pub. Date: Apr. 23, 2015

(65) Prior Publication Data
US 2016/0254786 A1    Sep. 1, 2016

(30) Foreign Application Priority Data
Oct. 18, 2013  (JP) .................. 2013-217276

(51) Int. Cl.
*H03G 3/20* (2006.01)
*H03F 1/02* (2006.01)
(Continued)

(52) U.S. Cl.
CPC ............. *H03F 1/0222* (2013.01); *H03F 3/19* (2013.01); *H03F 3/2173* (2013.01);
(Continued)

(58) Field of Classification Search
CPC ........ H03F 1/0222; H03F 3/19; H03F 3/2178; H03F 2200/171; H03F 2200/432;
(Continued)

(56) References Cited

FOREIGN PATENT DOCUMENTS

| JP | 2005-244950 A | 9/2005 |
| JP | 2010-45517 A | 2/2010 |
| WO | 2008/090712 A1 | 7/2008 |

OTHER PUBLICATIONS

Hsia et al. "Wideband High Efficiency Digitally-Assisted Envelope Amplifier with Dual Switching Stages for Radio Base-Station Envelope Tracking Power Amplifiers", IEEE MTT Symposium publication of May 2010, pp. 672-675.*

(Continued)

*Primary Examiner* — Steven J Mottola
*Assistant Examiner* — Hafizur Rahman
(74) *Attorney, Agent, or Firm* — Sughrue Mion, PLLC

(57) ABSTRACT

A power supply circuit (10) includes: a linear amplifier (11) for generating a linear amplification signal based on an input signal; a first switching amplifier (12) for generating a first switching amplification signal of a first frequency band based on the linear amplification signal; a second switching amplifier (13) for generating a second switching amplification signal of a second frequency band based on the first switching amplification signal; and a power supply unit (14) for supplying a combined signal in which the linear amplification signal and the first and second switching amplification signals are combined to an external circuit as a power supply. It is therefore possible to improve the power efficiency.

12 Claims, 7 Drawing Sheets

(51) Int. Cl.
    *H03F 3/19*      (2006.01)
    *H03F 3/217*     (2006.01)
(52) U.S. Cl.
    CPC ..... *H03F 3/2178* (2013.01); *H03F 2200/171* (2013.01); *H03F 2200/432* (2013.01); *H03F 2200/462* (2013.01); *H03F 2200/78* (2013.01)
(58) Field of Classification Search
    CPC .. H03F 2200/462; H03F 2200/78; H03F 1/06; H03F 3/21; H03F 3/343
    USPC ... 330/251, 297, 296, 291, 127, 295, 124 R, 330/51, 136; 323/234, 271; 375/238; 455/91, 127.1, 114.3, 115.1
    See application file for complete search history.

(56) References Cited

OTHER PUBLICATIONS

Donald F. Kimball, et al., "High-Efficiency Envelope-Tracking W-CDMA Base-Station Amplifier Using GaN HFETs", IEEE Transactions on Microwave Theory and Techniques, Nov. 2006, pp. 3848-3856, vol. 54, No. 11.
International Search Report for PCT/JP2014/002464 dated Jul. 1, 2014 [PCT/ISA/210].

* cited by examiner

POWER SUPPLY CIRCUIT, HIGH-FREQUENCY POWER AMPLIFICATION CIRCUIT, AND POWER SUPPLY CONTROL METHOD

CROSS REFERENCE TO RELATED APPLICATIONS

This application is a National Stage of International Application No. PCT/JP2014/002464, filed on May 9, 2014, which claims priority from Japanese Patent Application No. 2013217276, filed on Oct. 18, 2013, the contents of all of which are incorporated herein by reference in their entirety.

TECHNICAL FIELD

The present invention relates to a power supply circuit, a high-frequency power amplification circuit, and a power supply control method, and more particularly, to a power supply circuit, a high-frequency power amplification circuit, and a power supply control method that amplify an input signal and generate a power supply.

BACKGROUND ART

A modulation scheme used for radio communications such as a modern mobile phone and the like has a high-frequency utilization efficiency and a high peak-to-average power ratio (PAPR). In order to amplify a signal to which an amplitude modulation is applied by using an AB class amplifier that has been conventionally used in a radio communication field, it is necessary to use an amplifier operating with sufficient back-off to maintain a linearity. Generally, the required back-off value is at least approximately equal to a value of the PAPR. However, in the AB class amplifier, the maximum efficiency is obtained when it operates at the saturation point and the efficiency of the amplifier decreases with increasing the back-off value. Therefore, it is difficult to improve the power efficiency of the power amplifier for amplifying a high-frequency modulation signal having a high PAPR.

As a power amplifier for amplifying a modulation signal having a high PAPR with high efficiency, a polar modulation power amplifier is used. In the polar modulation power amplifier, the high-frequency modulation signal used for radio communication is generated from polar coordinate components of amplitude and phase. FIG. 9 shows an example of the polar modulation power amplifier (high-frequency power amplification circuit) disclosed as related art in Non-Patent Literature 1.

The circuit shown in FIG. 9 includes a high-frequency modulation signal input terminal 101, an amplitude signal input terminal 102, a power supply circuit 103, a high-frequency power amplifier 104, and a high-frequency modulation signal output terminal 105. The power supply circuit 103 further includes a linear amplifier 106, a subtractor 107, a current detection resistor 108, a hysteresis comparator 109, a switching amplifier 110, an inductor 111, and a power supply terminal 112.

A harmonic modulation signal that is amplitude-modulated or phase-modulated is input to the high-frequency modulation signal input terminal 101 and this harmonic modulation signal is transmitted to the high-frequency power amplifier 104. An amplitude signal in the harmonic modulation signal input through the high-frequency modulation signal input terminal 101 is input to the amplitude signal input terminal 102. The signal input through the amplitude signal input terminal 102 is highly efficiently amplified by the power supply circuit 103 and is supplied from the power supply terminal 112 as a power supply of the high-frequency power amplifier 104. The high-frequency power amplifier 104 amplifies the signal input through the high-frequency modulation signal input terminal 101 and outputs the amplified signal to the high-frequency modulation signal output terminal 105.

The power supply circuit 103 has a configuration in which both the switching amplifier 110 and the linear amplifier 106 are arranged so as to amplify the input signal in high efficiency and with low distortion. The amplitude signal input through the amplitude signal input terminal 102 is input to the linear amplifier 106. The output impedance of the linear amplifier 106 is low. The linear amplifier 106 linearly amplifies the input signal and outputs the amplified signal. The signal output by the linear amplifier 106 is transmitted to the power supply terminal 112 through the current detection resistor 108.

The subtractor 107 is connected to both ends of the current detection resistor 108 and outputs a value obtained by subtracting a voltage of the power supply terminal 112 from a voltage of the output signal of the linear amplifier 106. Here, because the input impedance of the subtractor 107 is high, the subtractor 107 does not consume a large amount of electric power supplied to the power supply terminal 112 and the output signal of the linear amplifier 106. Further, because the impedance of the current detection resistor 108 is set to low, the voltage applied to both ends of the current detection resistor 108 is negligibly small compared to the voltage applied to the power supply terminal 112.

The subtractor 107 outputs the output signal, which is a subtraction result, to the hysteresis comparator 109. The hysteresis comparator 109 makes a sign determination of the input signal and outputs the result of the determination to the switching amplifier 110. However, the hysteresis comparator 109 has a function to hold the latest output state and has a hysteresis width (V_hys), if the latest output state is "low", the output state changes to "high" when the input signal level becomes equal to or greater than V_hys/2 and if the latest output state is "high", the output state changes to "low" when the input signal level becomes equal to or smaller than −V_hys/2.

The switching amplifier 110 amplifies the signal input through the hysteresis comparator 109 and outputs the amplified signal to the power supply terminal 112 via the inductor 111. In this case, the current supplied from the switching amplifier 110 via the inductor 111 and the current supplied from the linear amplifier 106 via the current detection resistor 108 are combined and the power is supplied from the power supply terminal 112.

The above-mentioned power supply circuit 103 has two advantages: high linearity of the linear amplifier 106 and high efficiency of the switching amplifier 110. This is because in the power supply circuit 103, the output voltage is determined by the linear amplifier 106 having low output impedance and most of the output current is supplied by the switching amplifier 110 with high efficiency. The current output through the power supply terminal 112 is a sum of the output current of the linear amplifier 106 and the output current of the switching amplifier 110. A potential of the power supply terminal 112 is determined by the linear amplifier 106 having low output impedance. In order to maintain the electric potential of the power supply terminal 112 to a target value, the current is supplied by the linear amplifier 106. The output current of the linear amplifier 106 is detected by using the current detection resistor 108 and the hysteresis comparator 109 and the current supplied by the switching amplifier 110 is adjusted so that the output current of the linear amplifier 106 is prevented from becoming excessive.

By using the above-mentioned method, most of the current output through the power supply terminal 112 is supplied by the switching amplifier 110 and the output current of the linear amplifier 106 can be used only for correction of an error component of the switching amplifier 110.

CITATION LIST

Non Patent Literature

[Non-Patent Literature 1] Donald F. Kimbal, Jinho Jeong, Chin Hsia, Paul Draxler, Sandro Lanfranco, Walter Nagy, Kevin Linthicum, Lawrence E. Larson, Peter M. Asbeck, [High-Efficiency Envelope-Tracking W-CDMA Base-Station Amplifier Using GaN HFETs], IEEE TRANSACTIONS ON MICROWAVE THEORY AND TECHNIQUES, VOL. 54, NO. 11, NOVEMBER 2006, pp. 3848-3856

SUMMARY OF INVENTION

Technical Problem

However, the power supply circuit 103 disclosed in Non-Patent Literature 1 has the following problem.

The problem of the power supply circuit 103 is that it is required to further improve the power efficiency thereof. That is, in the related art such as the power supply circuit 103, it is difficult to improve the power efficiency thereof.

In order to increase the power efficiency of the power supply circuit 103, it is required to reduce the output current of the linear amplifier 106 whose power efficiency is low. In order to reduce the output current of the linear amplifier 106, it is required to broaden the frequency bandwidth of the signal to be amplified by the switching amplifier 110 in the power supply circuit 103. In order to broaden the frequency bandwidth of the signal to be amplified by the switching amplifier 110 in the power supply circuit 103, it is required to shorten the switching cycle of the switching amplifier 110. While the bandwidth of the switching amplifier 110 is broadened when the switching cycle of the switching amplifier 110 is shortened, the power efficiency of the switching amplifier 110 is degraded. This is because the number of times that a through current or charging or discharging of a parasitic capacitance generated when the level of the switching amplifier 110 is switched between high and low occurs increases. Therefore, the actual power efficiency of the power supply circuit 103 becomes maximum in a switching cycle of the switching amplifier 110 and the power efficiency of the power supply circuit 103 does not improve any more even when the switching cycle becomes shorter or longer than this cycle.

The above problem becomes more serious as the bandwidth of the signal to be amplified by the power supply circuit 103 becomes wider. This is because, in order to reduce the output current of the linear amplifier 106, the bandwidth of the switching amplifier 110 needs to be sufficiently wide with respect to the bandwidth of the signal to be amplified and the switching cycle needs to be shortened as the bandwidth of the signal to be amplified becomes wider.

In view of the aforementioned problem, the present invention aims to provide a power supply circuit, a high-frequency power amplification circuit, and a power supply control method capable of improving a power efficiency.

Solution to Problem

A power supply circuit according to the present invention includes: a linear amplifier for generating a linear amplification signal based on an input signal; a first switching amplifier for generating a first switching amplification signal of a first frequency band based on the linear amplification signal; a second switching amplifier for generating a second switching amplification signal of a second frequency band based on the first switching amplification signal; and a power supply unit for supplying a combined signal in which the linear amplification signal and the first and second switching amplification signals are combined to an external circuit as a power supply.

A high-frequency power amplification circuit according to the present invention includes: a high-frequency power amplifier that amplifies a high-frequency modulation signal that is input; a linear amplifier for generating a linear amplification signal based on an amplitude signal which is an amplitude component of the high-frequency modulation signal; a first switching amplifier for generating a first switching amplification signal of a first frequency band based on the linear amplification signal; a second switching amplifier for generating a second switching amplification signal of a second frequency band based on the first switching amplification signal; and a power supply unit for supplying a combined signal obtained by combining the linear amplification signal and the first and second switching amplification signals to the high-frequency power amplifier as a power supply.

A power supply control method according to the present invention is a power supply control method in a power supply circuit, in which: the power supply circuit generates a linear amplification signal based on an input signal, the power supply circuit generates a first switching amplification signal of a first frequency band based on the linear amplification signal, the power supply circuit generates a second switching amplification signal of a second frequency band based on the first switching amplification signal; and the power supply circuit supplies a combined signal obtained by combining the linear amplification signal and the first and second switching amplification signals to an external circuit as a power supply.

Advantageous Effects of Invention

According to the present invention, it is possible to provide a power supply circuit, a high-frequency power amplification circuit, and a power supply control method capable of improving a power efficiency.

DESCRIPTION OF EMBODIMENTS (Outline of Exemplary Embodiments)

Figure 1:
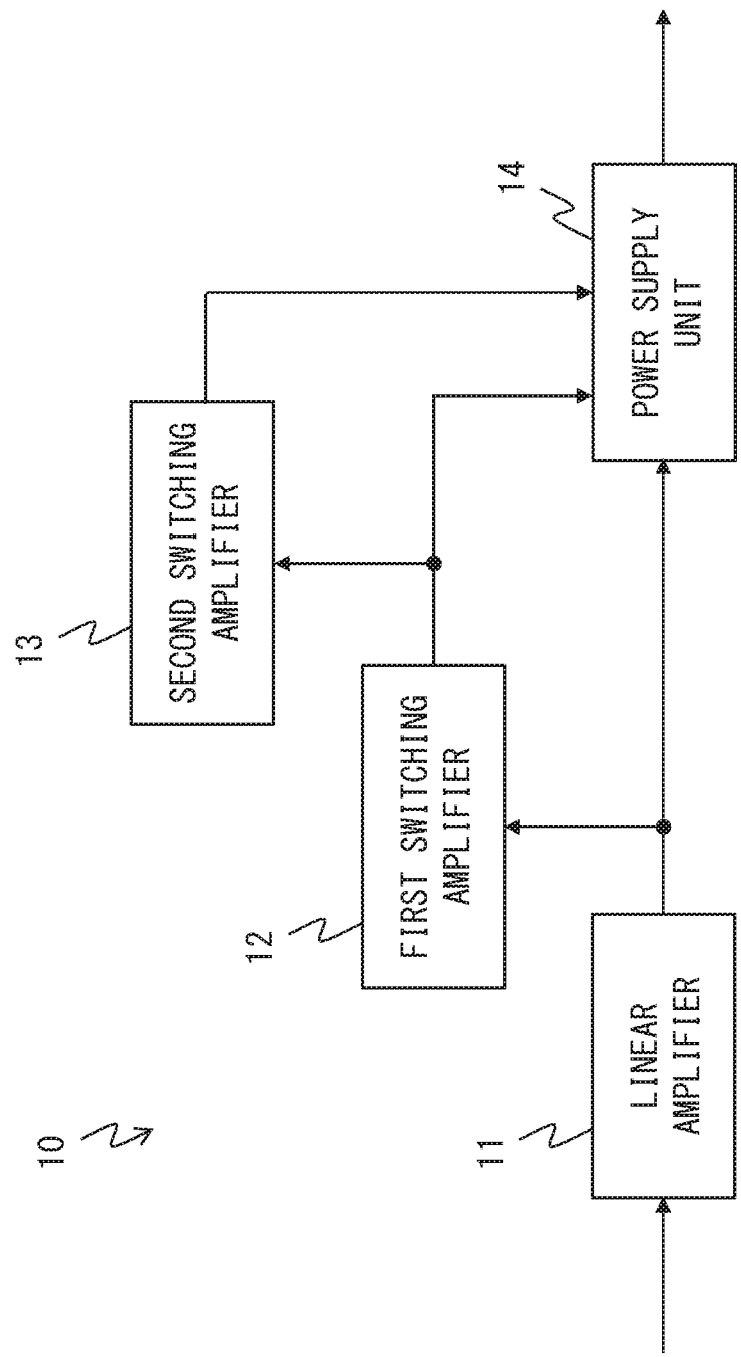
FIG. 1 is a schematic configuration diagram for describing an outline of a power supply circuit according to exemplary embodiments.

Prior to the description of exemplary embodiments, the outline of the characteristics of the exemplary embodiments will be described. FIG. 1 is a schematic configuration of a power supply circuit according to the exemplary embodiments.

As shown in FIG. 1, a power supply circuit 10 according to the exemplary embodiments includes a linear amplifier 11, a first switching amplifier 12, a second switching amplifier 13, and a power supply unit 14. The linear amplifier 11 generates a linear amplification signal based on an input signal. The first switching amplifier 12 generates a first switching amplification signal of a first frequency band based on the linear amplification signal generated by the linear amplifier 11. The second switching amplifier 13 generates a second switching amplification signal of a second frequency band based on the first switching amplification signal generated by the first switching amplifier 12. The power supply unit 14 supplies a combined signal obtained by combining the linear amplification signal generated by the linear amplifier 11, the first switching amplification signal generated by the first switching amplifier 12, and the second switching amplification signal generated by the second switching amplifier 13 to an external circuit as a power supply.

As described above, the plurality of switching amplifiers amplify signals in respective frequency bands, whereby it is possible to broaden the frequency bandwidth of the switching amplifiers. It is therefore possible to reduce the output current of the linear amplifier, whereby the power efficiency of the power supply circuit can be improved.

(First Exemplary Embodiment)

In the following description, with reference to the drawings, a first exemplary embodiment will be described. This exemplary embodiment shows an example in which two switching amplifiers are included in a power supply circuit.

Figure 2:
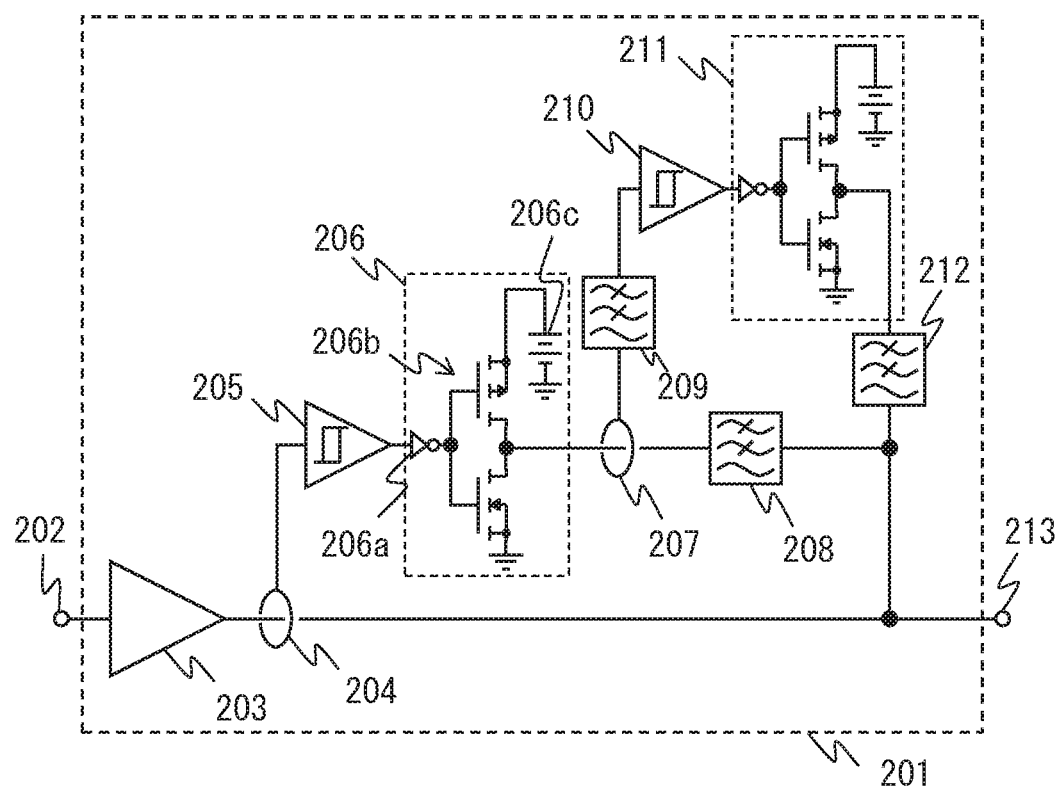
FIG. 2 is a block diagram showing a configuration of a power supply circuit according to a first exemplary embodiment.

FIG. 2 is a block diagram showing a configuration example of a power supply circuit 201 according to this exemplary embodiment. As shown in FIG. 2, the power supply circuit 201 according to this exemplary embodiment includes a signal input terminal 202, a linear amplifier 203, a first current detector 204, a first hysteresis comparator 205, a first switching amplifier 206, a second current detector 207, a first low-pass filter 208, a second low-pass filter 209, a second hysteresis comparator 210, a second switching amplifier 211, a third low-pass filter 212, and a signal output terminal 213.

The signal input terminal 202 receives a signal to be amplified (input signal). The linear amplifier 203 amplifies (linearly amplifies) the signal input through the signal input terminal 202 and outputs the amplified signal (linear amplification signal) to the signal output terminal 213.

Figure 9:
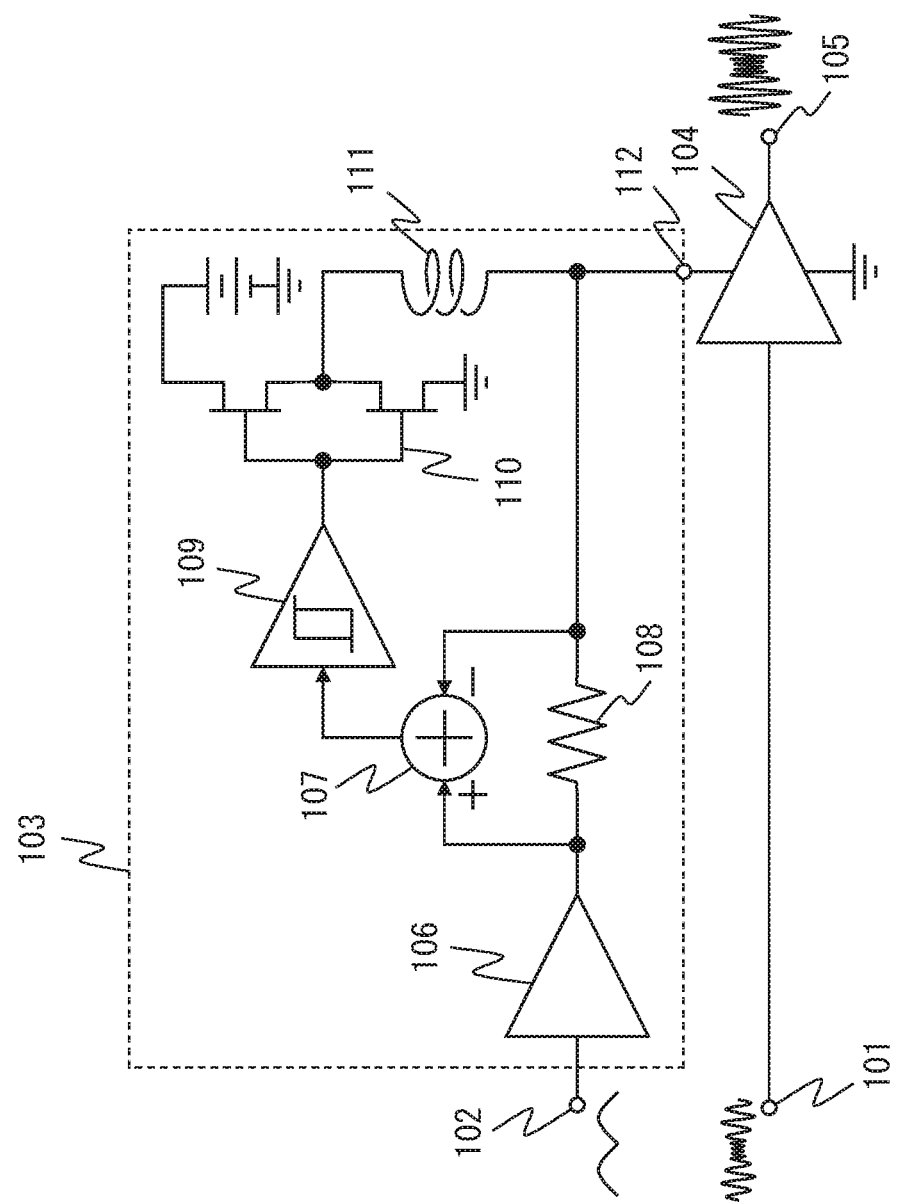
FIG. 9 is a block diagram showing a configuration of a polar modulation power amplifier disclosed in Non-Patent Literature 1.

The first current detector 204 detects a current value (current components) of the signal input to the signal output terminal 213 by the linear amplifier 203 and outputs a signal (first detection signal) according to the current value that has been detected. For example, the first current detector 204 may be formed of the current detection resistor 108 and the subtractor 107 as shown in FIG. 9 or may have another configuration as long as it can output a signal according to the detected current (the same is applicable to the second current detector 207).

The first hysteresis comparator 205 receives the output signal of the current detector 204, determines whether the signal level of the input signal is high or low (positive/negative determination or level determination), and outputs the determination result (first determination signal). The first switching amplifier 206 receives the output of the first hysteresis comparator 205, amplifies (switching-amplifies) the received signal, and outputs the amplified signal (first switching amplification signal). The first switching amplifier 206 is formed of a non-inverting amplification circuit. For example, as one example of the non-inverting amplification circuit, the first switching amplifier 206 includes a buffer circuit 206a that inverts and amplifies the input signal and an inverter circuit (switching element) 206b that is switched (ON/OFF) according to the signal via the buffer circuit 206a. The inverter circuit 206b includes two MOS transistors connected in series between a power supply 206c and the GND. The second switching amplifier 211 has a configuration similar to that of the first switching amplifier 206.

The first low-pass filter (output low-pass filter) 208 removes high-frequency components from the output signal of the first switching amplifier 206 and outputs the resulting signal (first switching amplification signal obtained by removing high-frequency components) to the signal output terminal 213. The first current detector 204, the first hysteresis comparator 205, the first switching amplifier 206, and the first low-pass filter 208 form a first switching amplifier that generates the first switching amplification signal of the first frequency band.

The second current detector 207 detects current components from the output signal of the first switching amplifier 206 and outputs the detection signal (second detection signal). The second low-pass filter (input low-pass filter) 209 removes high-frequency components from the output signal of the second current detector 207 and outputs the resulting signal. The second hysteresis comparator 210 receives the output signal of the second low-pass filter 209 (second detection signal after the high-frequency components are removed) and outputs the determination signal (second determination signal) where the signal level (high/low) has been determined. The second switching amplifier 211 receives the output of the second hysteresis comparator 210 and outputs the amplified (switching-amplified) signal (second switching signal).

The third low-pass filter (output low-pass filter) 212 removes high-frequency components from the output signal of the second switching amplifier 211 and outputs the resulting signal (second switching amplification signal after the high-frequency components are removed) to the signal output terminal 213. The second current detector 207, the second low-pass filter 209, the second hysteresis comparator 210, the second switching amplifier 211, and the third low-pass filter 212 form a second switching amplifier that generates the second switching amplification signal of the second frequency band.

The signal output terminal (signal output unit) 213 outputs a combined signal obtained by combining the output signal of the linear amplifier 203, the output signal of the first low-pass filter 208, and the output signal of the third low-pass filter 212. The signal output terminal 213 forms a power supply unit that combines the linear amplification signal output from the linear amplifier 203, the first switching amplification signal output from the first low-pass filter 208, and the second switching amplification signal output from the third low-pass filter 212 and supplies the combined signal to an external circuit as a power supply.

The cutoff frequency of the first low-pass filter 208 is set to a frequency higher than the cutoff frequency of the third low-pass filter 212 (the cutoff frequency of the third low-pass filter 212 is lower than the cutoff frequency of the first low-pass filter 208).

Further, the first hysteresis comparator 205 has a function to hold the latest output state and has a hysteresis width (V_hys1). When the latest output signal is low, the output state changes to high when the voltage of the input signal becomes equal to or greater than V_hys1/2. In contrast, if the latest output signal is high, the output state changes to low when the voltage of the input signal becomes equal to or lower than −V_hys1/2.

In a similar way, the second hysteresis comparator 210 has a function to hold the latest output state and has a hysteresis width (V_hys2). When the latest output signal is low, the output state changes to high when the voltage of the input signal becomes equal to or greater than V_hys2/2. In contrast, if the latest output signal is high, the output state changes to low when the voltage of the input signal becomes equal to or lower than −V_hys2/2.

The bandwidth of the signal amplified by the first switching amplifier 206 is determined by the bandwidth of the first low-pass filter 208. In contrast, the bandwidth of the signal amplified by the second switching amplifier 211 is determined by the bandwidth in which the first low-pass filter 208, the second low-pass filter 209, and the third low-pass filter 212 are combined in series. Accordingly, with the configuration as stated above, a signal having a relatively high frequency is amplified by the first switching amplifier 206 (high-frequency amplifier in a first frequency band) and a signal having a low frequency is amplified by a second switching amplifier 211 (low-frequency amplifier in a second frequency band).

Since the frequency bands of the signals to be amplified by the first switching amplifier 206 and the second switching amplifier 211 are different from each other, the two switching amplifiers are preferably formed to have configurations specific for the respective bandwidths. For example, the first switching amplifier 206 may employ a device in which a parasitic capacitance is small (and an ON-resistance is large) to improve the efficiency of the first switching amplifier 206 when the first switching amplifier 206 is operated at a high speed and the second switching amplifier 211 may employ a device in which an ON-resistance is small (and a parasitic capacitance is large) to improve the efficiency of the second switching amplifier 211 when the second switching amplifier 211 is operated at a low speed.

By separately using the switching amplifiers as stated above, the total frequency bandwidth of the first switching amplifier 206 and the second switching amplifier 211 can be broadened and the power loss can be suppressed. As a result, the output current of the linear amplifier 203 can be reduced and the power efficiency of the whole power supply circuit 201 is improved.

While the second current detector 207 is arranged between the first switching amplifier 206 and the first low-pass filter 208 in FIG. 2, the positional relation between the second current detector 207 and the first low-pass filter 208 may be reversed. It is required, however, that the second current detector 207 be provided in a stage previous to the circuit in which the output signal of the first low-pass filter 208 is combined with the output signal of the linear amplifier 203 and the output signal of the third low-pass filter 212. The role of the second current detector 207 is to detect the current input to the signal output terminal 213 by the first switching amplifier 206 via the first low-pass filter 208, and the second current detector 207 may have any configuration as long as this role is fulfilled.

The second low-pass filter 209 is provided to make the frequency band in which the second hysteresis comparator 210 and the second switching amplifier 211 are operated low by removing high-frequency components from the output of the second current detector 207. Therefore, the cutoff frequency of the second low-pass filter 209 is preferably made lower than the cutoff frequency of the first low-pass filter 208. However, no problem occurs even when the cutoff frequency of the second low-pass filter 209 is set to be higher than the cutoff frequency of the first low-pass filter 208. Further, the second low-pass filter 209 may be omitted and the output of the second current detector 207 may be directly coupled to the input of the second hysteresis comparator 210.

Further, while the power supply of the first switching amplifier 206 and the power supply of the second switching amplifier 211 are separately shown in the circuit diagram shown in FIG. 2, a common power may be supplied to the two switching amplifiers (inverter circuits).

Further, in the circuit diagram shown in FIG. 2, the circuit block including the second hysteresis comparator 210, the second switching amplifier 211, and the third low-pass filter 212 may be replaced by a general DC-DC converter. In this case, in the DC-DC converter, the output signal of the second low-pass filter 209 is used as a reference signal and an output terminal of the DC-DC converter is connected to the signal output terminal 213.

Figure 3:
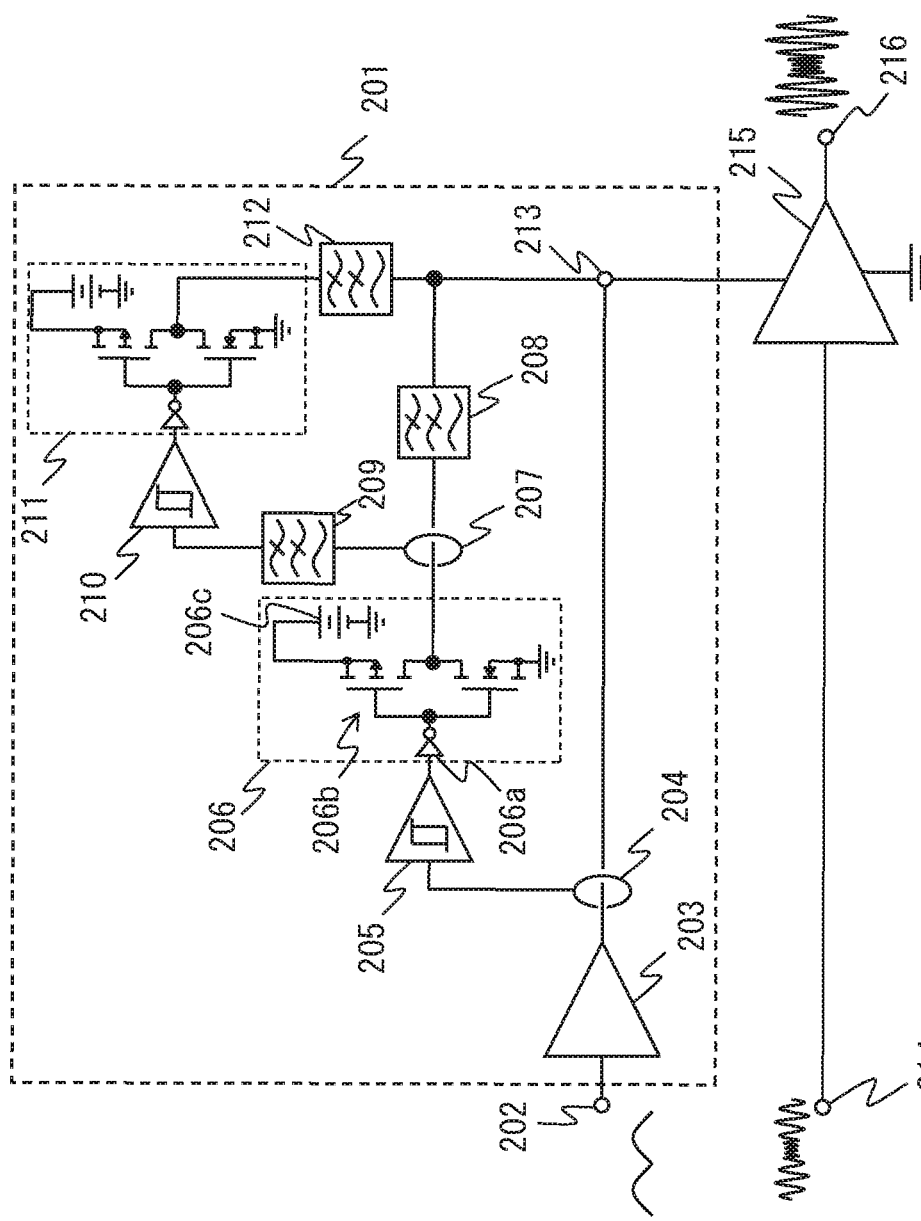
FIG. 3 is a block diagram showing a configuration of a high-frequency power amplification circuit according to the first exemplary embodiment.

Further, using the power supply circuit 201 according to this exemplary embodiment, a polar modulation power amplifier (high-frequency power amplification circuit) may be formed, similar to FIG. 9. As shown in FIG. 3, for example, the high-frequency power amplification circuit according to this exemplary embodiment includes a signal input terminal 202, a power supply circuit 201, a high-frequency modulation signal input terminal 214, a high-frequency power amplifier 215, and a high-frequency modulation signal output terminal 216.

A harmonic modulation signal that is amplitude-modulated or phase-modulated is input to the high-frequency modulation signal input terminal 214, the high-frequency power amplifier 215 amplifies this high-frequency modulation signal, and the amplified signal is input to the high-frequency modulation signal output terminal 216. In this case, the signal input terminal 202 serves as an amplitude signal input terminal and receives an amplitude signal (amplitude components) in the harmonic modulation signal input to the high-frequency modulation signal input terminal 214. Further, the signal output terminal 213 of the power supply circuit 201 serves as a power supply terminal and supplies a power supply generated by the power supply circuit 201 to the high-frequency power amplifier 215.

As described above, in this exemplary embodiment, a high linearity, a wide frequency bandwidth, a large power, and a high power efficiency can be concurrently achieved in the power supply circuit and the high-frequency power amplifier (high-frequency power amplification circuit) including the power supply circuit.

For example, as described above, in the power supply circuit 201, the output current of the first switching amplifier 206 is monitored and the second switching amplifier 211 is operated so that the output current of the first switching amplifier 206 becomes substantially zero in a low-frequency region. Further, the first switching amplifier is designed to decrease the parasitic capacitance and the second switching amplifier 211 is designed to decrease the ON-resistance. Further, the cutoff frequency of the first low-pass filter 208 is made higher than the cutoff frequency of the third low-pass filter 212, whereby the operating bandwidth of the first switching amplifier 206 and the operating bandwidth of the second switching amplifier 211 are separated. According to these operations, the operating bandwidth in which the first switching amplifier 206 and the second switching amplifier 211 are summed up is broadened, whereby the output current of the linear amplifier 203 is reduced and the power efficiency is improved.

That is, according to this exemplary embodiment, it is possible to broaden the frequency bandwidth of the switching amplifier without decreasing the power efficiency of the switching amplifier. It is therefore possible to easily reduce the output current of the linear amplifier in which the power efficiency is poor and to improve the power efficiency of the whole power supply circuit.

(Second Exemplary Embodiment)

Hereinafter, with reference to the drawings, a second exemplary embodiment will be described. In this exemplary embodiment, a plurality of (n) switching amplifiers are included in a power supply circuit.

Figure 4:
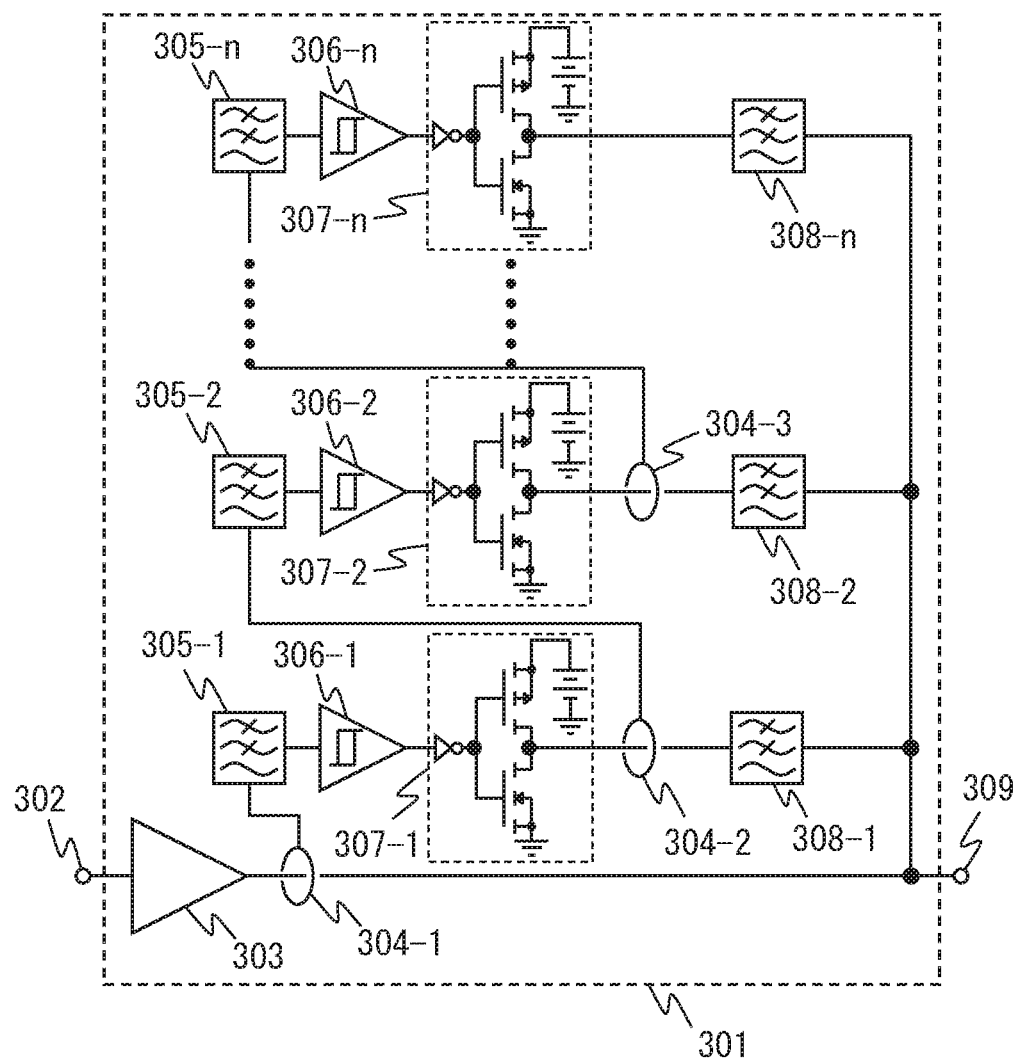
FIG. 4 is a block diagram showing a configuration of a power supply circuit according to a second exemplary embodiment.

FIG. 4 is a block diagram showing a configuration example of a power supply circuit 301 according to this exemplary embodiment. As shown in FIG. 4, the power supply circuit 301 includes a signal input terminal 302, a linear amplifier 303, n (k-th) current detectors 304-k ($1 \leq k \leq n$), n (k-th) input filters 305-k ($1 \leq k \leq n$), n (k-th) hysteresis comparators 306-k ($1 \leq k \leq n$), n (k-th) switching amplifiers 307-k ($1 \leq k \leq n$), n (k-th) output filters 308-k ($1 \leq k \leq n$), and a signal output terminal 309. The symbol n is an integer equal to or greater than two.

For example, the k-th current detector 304-k, the k-th input filter 305-k, the k-th hysteresis comparator 306-k, the k-th switching amplifier 307-k, the k-th output filter 308-k form a switching amplifier that generates a switching amplification signal having a predetermined frequency band.

The signal input terminal 302 receives a signal to be amplified. The linear amplifier 303 amplifies the signal input through the signal input terminal 302 and outputs the amplified signal to the signal output terminal 309. The first current detector 304-1 detects the current value of the signal output to the signal output terminal 309 by the linear amplifier 303 and outputs the current value.

The k-th input filter 305-k removes high-frequency components from the output signal of the k-th current detector 304-k and outputs the resulting signal. The k-th hysteresis comparator 306-k receives the output signal of the k-th input filter 305-k, determines the signal level (high or low) of the received signal, and outputs the determination result. The k-th switching amplifier 307-k receives the output signal of the k-th hysteresis comparator 306-k, amplifies the signal, and outputs the amplified signal.

The k-th output filter 308-k removes high-frequency components from the output signal of the k-th switching amplifier 307-k and outputs the resulting signal to the signal output terminal 309. The L-th ($2 \leq L \leq n$) current detector 304-L detects the current value of the signal output to the signal output terminal 309 by the (L−1)-th switching amplifier 307-(L−1) via the (L−1)-th output filter 308-(L−1) and outputs the current value. The signal output from the signal output terminal 309 is obtained by combining the output signal of the linear amplifier 303 and the output signals of the n output filters 308-k ($1 \leq k \leq n$).

Further, the k-th hysteresis comparator 306-k has a function to hold the latest output state and has a hysteresis width (V_hys_k). When the latest output signal is low, the output state changes to high when the voltage of the input signal becomes equal to or greater than V_hys_k/2. In contrast, if the latest output signal is high, the output state changes to low when the voltage of the input signal becomes equal to or lower than −V_hys_k/2.

In the aforementioned configuration, the bandwidth of the signal amplified by the (L−1)-th switching amplifier 307-(L−1) is preferably designed so that it is higher than the bandwidth of the signal amplified by the L-th switching amplifier 307-L. Specifically, the cutoff frequency of the L-th output filter 308-L is set to a frequency lower than the cutoff frequency of the (L−1)-th output filter 308-(L−1). However, no problem occurs even when the n output filters 308-k are designed in a way different from the one described above.

Since the frequency bands of the signals to be amplified by the n switching amplifiers 307-k are different from one another, the n switching amplifiers 307-k are preferably formed to have configurations specific for the respective bandwidths. For example, the L-th switching amplifier 307-L may employ a device in which an ON-resistance is small (and a parasitic capacitance is large) compared to the (L−1)-th switching amplifier 307-(L−1), whereby the efficiency when the L-th switching amplifier 307-L is operated at a low speed may be improved.

By separately using the switching amplifiers as stated above, the total frequency bandwidth of the n switching amplifiers 307-k can be broadened and the power loss can be suppressed. As a result, the output current of the linear amplifier 303 can be reduced and the power efficiency of the whole power supply circuit 301 is improved.

While the L-th current detector 304-L is arranged between the (L−1)-th switching amplifier 307-(L−1) and the (L−1)-th output filter 308-(L−1) in FIG. 4, the positional relation between the L-th current detector 304-L and the (L−1)-th output filter 308-(L−1) may be reversed. The L-th current detector 304-L is required to be provided in a stage previous to the circuit in which the output signal of the (L−1)-th output filter 308-(L−1) is combined with the output signal of the linear amplifier 303 and the output signal of another output filter 308-k (k≠L−1). The role of the L-th current detector 304-L is to detect the current output to the signal output terminal 309 by the (L−1)-th switching amplifier 307-(L−1) via the (L−1)-th output filter 308-(L−1), and may have any configuration as long as this role is fulfilled.

The L-th ($2 \leq L \leq n$) input filter 305-L is provided to make the frequency band in which the L-th hysteresis comparator 306-L and the L-th switching amplifier 307-L are operated low by removing high-frequency components from the output of the L-th current detector 304-L. It is therefore desired to make the cutoff frequency of the L-th input filter 305-L lower than the cutoff frequency of the (L−1)-th output filter 308-(L−1). However, no problem occurs even when the cutoff frequency of the L-th input filter 305-L is set to be higher than the cutoff frequency of the (L−1)-th output filter 308-(L−1). Further, the k (1≤k≤n)-th input filter 305-k may be omitted and the output of the k-th current detector 304-k may be directly coupled to the input of the k-th hysteresis comparator 306-k.

While the power supplies of the n switching amplifiers 307-k are separately shown in the circuit diagram shown in FIG. 4, a common power supply may be used.

Further, in the circuit diagram shown in FIG. 4, the circuit block formed of the k-th hysteresis comparator 306-k, the k-th switching amplifier 307-k, and the k-th output filter 308-k may be replaced by a general DC-DC converter. In this case, in the DC-DC converter, the output signal of the k-th input filter 305-k is used as a reference signal and an output terminal of the DC-DC converter is connected to the signal output terminal 309.

Further, similar to FIG. 3 of the first exemplary embodiment, a polar modulation power amplifier (high-frequency power amplification circuit) may be formed using the power supply circuit 301 according to this exemplary embodiment. That is, the high-frequency power amplification circuit according to this exemplary embodiment may include a signal input terminal 302, a power supply circuit 301, a high-frequency modulation signal input terminal 214, a high-frequency power amplifier 215, and a high-frequency modulation signal output terminal 216, the signal input terminal 302 may be used as an amplitude signal input terminal, and the signal output terminal 309 may be used as a power supply terminal.

(Third Exemplary Embodiment)

Hereinafter, with reference to the drawings, a third exemplary embodiment will be described. In this exemplary embodiment, a power supply circuit includes a plurality of (n) switching amplifiers, a signal conversion circuit, and a pulse signal generator.

Figure 5:
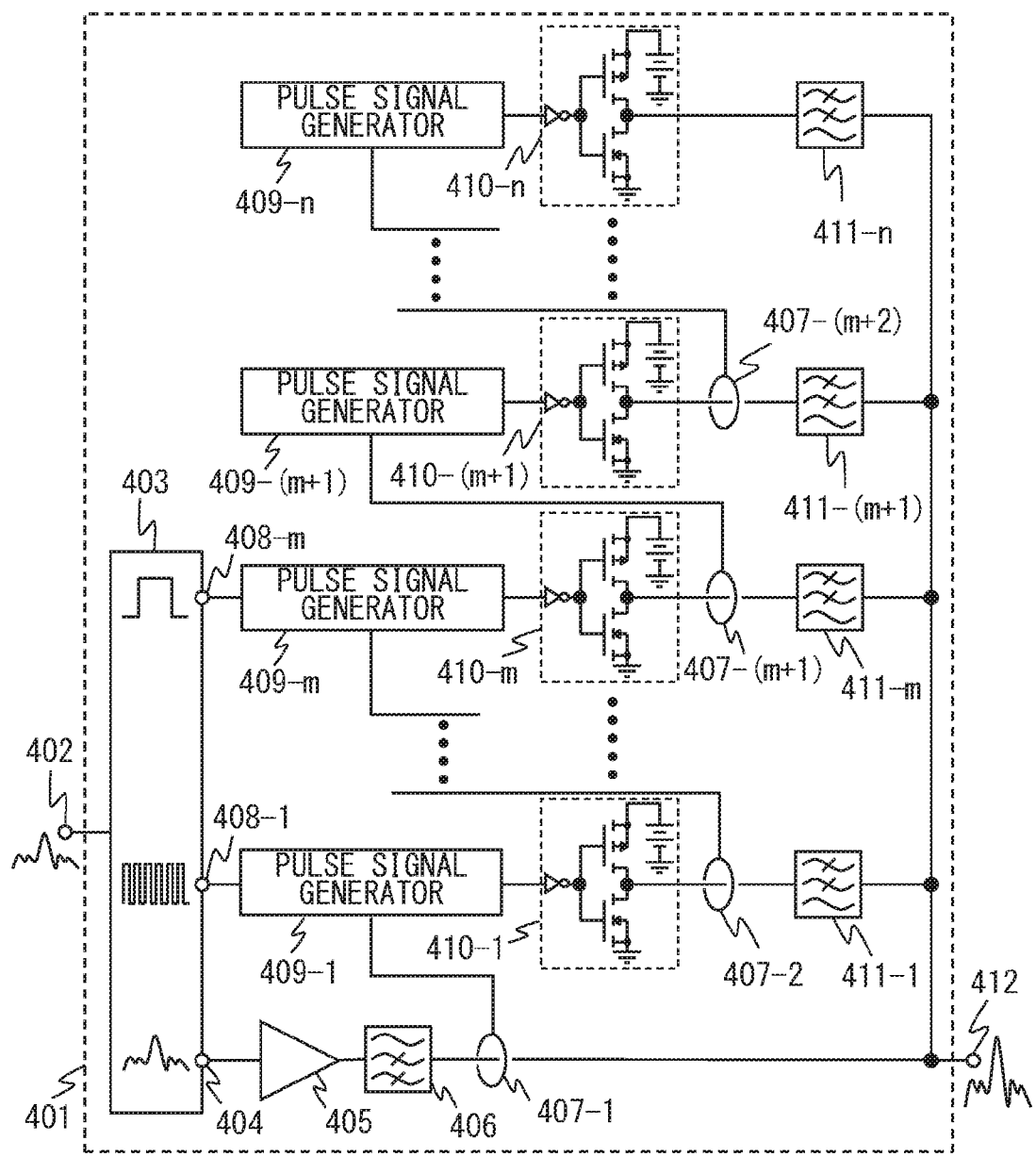
FIG. 5 is a block diagram showing a configuration of a power supply circuit according to a third exemplary embodiment.

FIG. 5 is a block diagram showing a configuration example of a power supply circuit 401 according to this exemplary embodiment. As shown in FIG. 5, the power supply circuit 401 includes a signal input terminal 402, a signal conversion circuit 403, an analog signal terminal 404, a linear amplifier 405, a high-pass filter 406, n (k-th) current detectors 407-k (1≤k≤n), m (p-th) digital signal terminals 408-p (1≤p≤m), n (k-th) pulse signal generators 409-k (1≤k≤n), n (k-th) switching amplifiers 410-k (1≤k≤n), n (k-th) low-pass filters 411-k (1≤k≤n), and a signal output terminal 412. The symbol n is an integer equal to or greater than two and m is an integer from 1 to n, inclusive.

For example, the k-th current detector 407-k, the k-th pulse signal generator 409-k, the k-th switching amplifier 410-k, and the k-th low-pass filter 411-k form a switching amplifier that generates a switching amplification signal having a predetermined frequency band.

The signal input terminal 402 receives a signal to be amplified. The signal conversion circuit 403 receives the signal from the signal input terminal 402, performs a signal operation, and outputs an analog signal from the analog signal terminal 404 and one-bit pulse signal (one-bit digital signal) from the digital signal terminal 408-p (1≤p≤m).

The linear amplifier 405 receives the signal output from the analog signal terminal 404, amplifies the received signal, and outputs the amplified signal. The high-pass filter 406 receives the output signal of the linear amplifier 405, removes low-frequency signals, and outputs the resulting signal to the signal output terminal 412. The current detector 407-1 detects the current value from the output signal of the high-pass filter 406 and outputs the detected value. The current detector 407-L (2≤L≤n) detects the current value from the output signal of the switching amplifier 410-(L−1) and outputs the detected value.

The pulse signal generator 409-p (1≤p≤m) generates a one-bit pulse signal from the output signals of the digital signal terminal 408-p and the current detector 407-p and outputs the one-bit pulse signal. The pulse signal generator 409-q (m+1≤q≤n) generates the one-bit pulse signal from the output signal of the current detector 407-q and outputs the generated signal. The switching amplifier 410-k (1≤k≤n) amplifies the output signal of the pulse signal generator 409-k and outputs the amplified signal. The low-pass filter 411-k removes high-frequency components from the output signal of the switching amplifier 410-k and outputs the resulting signal to the signal output terminal 412. The signal output from the signal output terminal 412 is obtained by combining the output signal of the linear amplifier 405 and the output signals of the n low-pass filters 411-k.

In the signal conversion circuit 403, a DC offset is applied to a signal and one-bit pulse pattern is generated. The DC offset means to change the rate of the DC voltage of the signal to be output from the signal output terminal 412 compared to the signal input through the signal input terminal 402. The signal to which the DC offset is applied is converted into one-bit signal using a one-bit ADC such as a delta-sigma Analog-to-Digital Converter (ADC) or a Pulse Width Modulator (PWM) circuit and the resulting signal is output from the digital signal terminal 408-p. Further, this one-bit ADC is designed to have time constants different from one another. In this case, the ADC that outputs the signal to the digital signal terminal 408-p preferably has a time constant larger than that of the ADC that outputs the signal to the digital signal terminal 408-(p+1) (in this example, 1≤p≤m−1). Further, by eliminating the DC offset from the signal output from the analog signal terminal 404, the maximum value of the input/output signal of the linear amplifier 405 may be decreased and the bias voltage of the linear amplifier 405 may be decreased. However, the aforementioned DC offset is not essential for the exemplary embodiments of the present invention and is not preferably applied depending on the type of the signal to be amplified and the type of the load connected to the signal output terminal 412.

Further, the circuit shown in FIG. 5 can be operated even when the high-pass filter 406 is omitted. However, when the high-pass filter 406 is omitted, the DC offset cannot be eliminated from the signal to be output from the analog signal terminal 404. Such changes in the circuit configuration may be performed in consideration of the easiness of implementation, the cost, or characteristics of the signal to be amplified, for example.

Figure 6:
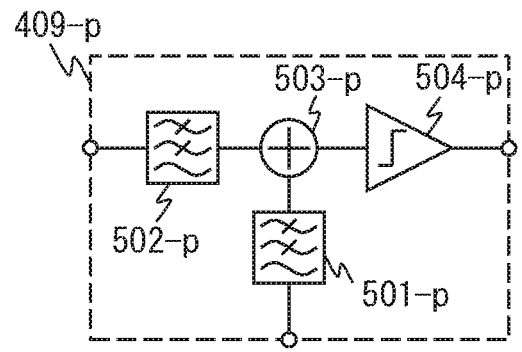
FIG. 6 is a block diagram showing an internal configuration of a pulse signal generator used in the power supply circuit according to the third exemplary embodiment.
Figure 7:
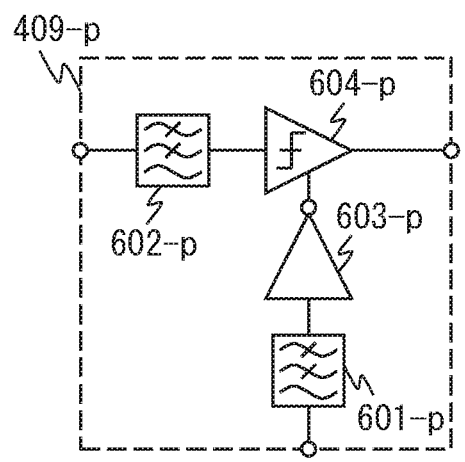
FIG. 7 is a block diagram showing an internal configuration of the pulse signal generator used in the power supply circuit according to the third exemplary embodiment.

The configurations of the pulse signal generator 409-p (1≤p≤m) and the pulse signal generator 409-q (m+1≤q≤n) will be described. FIGS. 6 and 7 are block diagrams showing a configuration example of the pulse signal generator 409-p (1≤p≤m). The pulse signal generator 409-p combines the one-bit digital signal and the analog signal.

The pulse signal generator 409-p shown in FIG. 6 includes a first input filter 501-p, a second input filter 502-p, an analog adder 503-p, and a comparator 504-p.

The first input filter 501-p receives the output signal of the current detector 407-p, removes high-frequency components from the received signal, and outputs the resulting signal. The second input filter 502-p receives the output signal of the digital signal terminal 408-p, removes high-frequency components from the received signal, and outputs the resulting signal. In this case, while the input signal of the second input filter 502-p is a rectangular wave, the output signal of the second input filter 502-p is a waveform having a finite slope such as a trapezoidal wave or a triangular wave. The analog adder 503-p receives the output signal of the first input filter 501-p and the output signal of the second input filter 502-p, adds the output signals, and outputs the resulting signal. The comparator 504-p receives the output signal of the analog adder 503-p, outputs a high level signal when the input signal is positive, and outputs a low level signal when the input signal is negative. The output signal of the comparator 504-p is output to the switching amplifier 410-p.

The pulse signal generator 409-p shown in FIG. 7 includes a first input filter 601-p, a second input filter 602-p, an inverting amplifier 603-p, and a comparator 604-p.

The first input filter 601-p receives the output signal of the current detector 407-p, removes high-frequency components from the received signal, and outputs the resulting signal. The second input filter 602-p receives the output signal of the digital signal terminal 408-p, removes high-frequency components from the received signal, and outputs the resulting signal. In this case, while the input signal of the second input filter 602-p is a rectangular wave, the output signal of the second input filter 602-p is a waveform having a finite slope such as a trapezoidal wave or a triangular wave. The inverting amplifier 603-p receives the output signal of the first input filter 601-p, inverts the polarity of the signal, and outputs the inverted signal. The comparator 604-p receives the output signal of the second input filter 602-p and the output signal of the inverting amplifier 603-p and outputs a high level signal when the output signal of the second input filter 602-p is larger than the output signal of the inverting amplifier 603-p and outputs a low level signal when the output signal of the second input filter 602-p is smaller than the output signal of the inverting amplifier 603-p. The output signal of this comparator 604-p is output to the switching amplifier 410-p.

Figure 8:
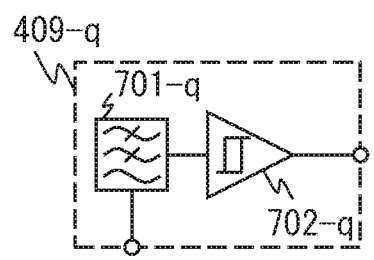
FIG. 8 is a block diagram showing an internal configuration of the pulse signal generator used in the power supply circuit according to the third exemplary embodiment.

FIG. 8 is a block diagram showing a configuration example of the pulse signal generator 409-q (m+1≤q≤n). The pulse signal generator 409-q shown in FIG. 8 includes an input filter 701-q and a hysteresis comparator 702-q.

The input filter 701-q receives the output signal of the current detector 407-q, removes high-frequency components from the received signal, and outputs the resulting signal. The hysteresis comparator 702-q receives the output signal of the input filter 701-q, determines whether the signal level is high or low, and outputs the result of the determination. The output signal of the hysteresis comparator 702-q is output to the switching amplifier 410-q. The hysteresis comparator 702-q has a function to hold the latest output state and has a hysteresis width (V_hys_q). When the latest output signal is low, the output state changes to high when the voltage of the input signal becomes equal to or greater than V_hys_q/2. In contrast, if the latest output signal is high, the output state changes to low when the voltage of the input signal becomes equal to or lower than −V_hys_q/2.

Further, a delay adjustment is performed on the signal output from the analog signal terminal 404 and the signal output from the digital signal terminal 408-p in such a way that these signals have the same phase when they are combined by the signal output terminal 412 after being amplified. For example, when the delay occurring in the amplification path of a digital signal including the pulse signal generator 409-p, the switching amplifier 410-p, and the low-pass filter 411-p is larger than the delay occurring in the amplification path of an analog signal including the linear amplifier 405 and the high-pass filter 406, the signal output from the analog signal terminal 404 is delayed compared to the signal output from the digital signal terminal 408-p and the delayed signal is output.

In the aforementioned configuration, the bandwidth of the signal amplified by the (L−1) (2≤L≤n)-th switching amplifier 410-(L−1) is preferably designed so that it becomes higher than the bandwidth of the signal amplified by the L-th switching amplifier 410-L. More specifically, the cutoff frequency of the L-th low-pass filter 411-L is set so that it becomes lower than the cutoff frequency of the (L−1)-th low-pass filter 411-(L−1). However, no problem occurs even when the n low-pass filters 411-k are designed in a way different from the one described above.

Since the frequency bands of the signals to be amplified by the n switching amplifiers 410-k (1≤k≤n) are different from one another, the n switching amplifiers 410-k (1≤k≤n) are preferably formed to have configurations specific for the respective bandwidths. For example, the L-th switching amplifier 410-L may employ a device in which an ON-resistance is small (and a parasitic capacitance is large) compared to the (L−1)-th switching amplifier 410-(L−1), whereby the efficiency when the L-th switching amplifier 410-L is operated at a low speed may be improved.

By separately using the switching amplifiers as stated above, it is possible to broaden the total frequency bandwidth of the n switching amplifiers 410-k and the power loss can be suppressed. As a result, the output current of the linear amplifier 405 is reduced and the power efficiency of the whole power supply circuit 401 is improved.

While the L-th current detector 407-L is arranged between the (L−1)-th switching amplifier 410-(L−1) and the (L−1)-th low-pass filter 411-(L−1) in FIG. 5, the positional relation between the L-th current detector 407-L and the (L−1)-th low-pass filter 411-(L−1) may be reversed. It is required, however, that the L-th current detector 407-L be provided in a stage previous to the circuit in which the output signal of the (L−1)-th low-pass filter 411-(L−1) is combined with the output signal of the linear amplifier 405 and the output signal of another low-pass filter 411-k (k≠L−1). The role of the L-th current detector 407-L is to detect the current output to the signal output terminal 412 by the (L−1)-th switching amplifier 410-(L−1) via the (L−1)-th low-pass filter 411-(L−1), and may have any configuration as long as this role is fulfilled. The same is applicable to the high-pass filter 406 and the first current detector 407-1. That is, the current that flows between the linear amplifier 405 and the high-pass filter 406 can be detected by the first current detector 407-1.

In the example shown in FIG. 6 (or FIG. 7), the input filter 501-p (or 601-p, 1≤p≤m) is provided to lower the frequency band in which the comparator 504-p (or 604-p) and the p-th switching amplifier 410-p operate by removing the high-frequency components from the output of the p-th current detector 407-p. It is therefore preferable to make the cutoff frequency of the input filter 501-p (or 601-p) lower than the cutoff frequency of the (p−1)-th low-pass filter 411-(p−1). However, no problem occurs even when the cutoff frequency of the input filter 501-p (or 601-p) is set to be higher than the cutoff frequency of the (p−1)-th low-pass filter 411-(p−1). Further, the input filter 501-p (or 601-p) may be omitted and the output of the p-th current detector 407-p may be directly coupled to the input of the analog adder 503-p (or the inverting amplifier 603-p).

In the example shown in FIG. 8, the input filter 701-q (m+1≤q≤n) is provided to make the frequency band in which the hysteresis comparator 702-q and the q-th switching amplifier 410-q are operated low by removing high-frequency components from the output of the q-th current detector 407-q. It is therefore preferable to make the cutoff frequency of the input filter 701-q lower than the cutoff frequency of the (q−1)-th low-pass filter 411-(q−1). However, no problem occurs even when the cutoff frequency of the input filter 701-q is set to be higher than the cutoff frequency of the (q−1)-th low-pass filter 411-(q−1). Further, the input filter 701-q may be omitted and the output of the q-th current detector 407-q may be directly coupled to the input of the hysteresis comparator 702-q.

Further, while the power supplies of the n switching amplifiers 410-k (1≤k≤n) are separately shown in the circuit diagram shown in FIG. 5, a common power supply may be used.

Further, in the circuit diagram shown in FIG. 5, the circuit block including the hysteresis comparator 702-q, the q-th switching amplifier 410-q, and the q-th output filter 411-q may be replaced by a typical DC-DC converter. In this case, in the DC-DC converter, the output signal of the input filter 701-q is used as a reference signal and the output terminal is connected to the signal output terminal 412.

Further, similar to FIG. 3 of the first exemplary embodiment, a polar modulation power amplifier (high-frequency power amplification circuit) may be formed using the power supply circuit 401 according to this exemplary embodiment. That is, the high-frequency power amplification circuit according to this exemplary embodiment may include a signal input terminal 402, a power supply circuit 401, a high-frequency modulation signal input terminal 214, a high-frequency power amplifier 215, and a high-frequency modulation signal output terminal 216, use the signal input terminal 402 as an amplitude signal input terminal, and use the signal output terminal 412 as a power supply terminal.

Note that the present invention is not limited to the aforementioned exemplary embodiments and may be changed as appropriate without departing from the spirit of the present invention.

While some or all of the aforementioned exemplary embodiments may be described as shown in the following Supplementary Notes, the exemplary embodiments are not limited to the following Supplementary Notes.

(Supplementary Note 1)

A power supply circuit comprising:

a linear amplifier that linearly amplifies a signal input from an external device;

a first current detector that detects a current value of a signal output from the linear amplifier;

a first hysteresis comparator that receives an output signal of the first current detector and determines whether the signal level is high or low;

a first switching amplifier that receives an output signal of the first hysteresis comparator and amplifies the received signal;

a first low-pass filter that removes high-frequency noise components from an output signal of the first switching amplifier and outputs the resulting signal;

a second current detector that detects current components of the output signal of the first switching amplifier;

a second low-pass filter that removes high-frequency noise components from an output signal of the second current detector and outputs the resulting signal;

a second hysteresis comparator that receives an output signal of the second low-pass filter and determines whether the signal level is high or low;

a second switching amplifier that receives an output signal of the second hysteresis comparator and amplifies the received signal; and a third low-pass filter that removes high-frequency noise components from an output signal of the second switching amplifier and outputs the resulting signal, wherein the power supply circuit combines the output signals of the linear amplifier, the first low-pass filter, and the third low-pass filter and outputs the combined signal to an external circuit.

(Supplementary Note 2)

The power supply circuit according to Supplementary Note 1, wherein a cutoff frequency of the first low-pass filter is higher than a cutoff frequency of the third low-pass filter.

(Supplementary Note 3)

The power supply circuit according to Supplementary Note 1 or 2, wherein:

the first hysteresis comparator has a function to hold the latest output state and has a hysteresis width ($V\_hys1$), if the latest output signal is low, the output state changes to high when the signal level of the input signal becomes equal to or greater than $V\_hys1/2$, and if the latest output signal is high, the output state changes to low when the signal level of the input signal becomes equal to or lower than $-V\_hys1/2$, and the second hysteresis comparator has a function to hold the latest output state and has a hysteresis width ($V\_hys2$), if the latest output signal is low, the output state changes to high when the signal level of the input signal becomes equal to or greater than $V\_hys2/2$, and if the latest output signal is high, the output state changes to low when the signal level of the input signal becomes equal to or lower than $-V\_hys2/2$.

(Supplementary Note 4)

A power supply circuit comprising:

a linear amplifier that amplifies an arbitrary input signal;

N (N is an integer equal to or greater than two) current detectors that detect a current value of an output signal of a switching amplifier or the linear amplifier;

N hysteresis comparators that receive output signals of the N current detectors and determine the signal level (high/low) of the received signal using a predetermined threshold;

N switching amplifiers that receive output signals of the N hysteresis comparators, amplify the signals, and output the amplified signals; and N output low-pass filters that receive output signals of the N switching amplifiers, remove high-frequency components from the received signals, and output the resulting signals, wherein:

the first current detector detects an output current of the linear amplifier, the L-th (L is an integer that falls within 2≤L≤N) current detector detects an output current of the (L−1)-th switching amplifier, the K-th (K is an integer that falls within 1≤K≤N) hysteresis comparator receives an output signal of the K-th current detector, the K-th switching amplifier receives an output signal of the K-th hysteresis comparator, the K-th output low-pass filter receives an output signal of the K-th switching amplifier, the K-th hysteresis comparator has a function to hold the latest output state and a high-side threshold ($Vhigh\_K$) and a low-side threshold ($Vlow\_K$), if the latest output signal is low, the output state changes to high when the voltage of the input signal becomes equal to or greater than $Vhigh\_K$, and if the latest output signal is high, the output state changes to low when the voltage of the input signal becomes equal to or lower than Vlow_K, and the output signals of the linear amplifier and the N output low-pass filters are combined and the combined signal is output to an external circuit.

(Supplementary Note 5)

The power supply circuit according to Supplementary Note 4, wherein a cutoff frequency of the L-th (L is an integer that falls within $2 \leq L \leq N$) output low-pass filter is lower than a cutoff frequency of the (L−1)-th output low-pass filter.

(Supplementary Note 6)

The power supply circuit according to Supplementary Note 4 or 5, wherein:

an input low-pass filter is provided between the K-th (K is an integer that falls within $1 \leq K \leq N$, a plurality of values may be selected as K) current detector and the K-th hysteresis comparator, and a signal obtained by removing high-frequency components of the output signal of the K-th current detector is output to the K-th hysteresis comparator.

(Supplementary Note 7)

The power supply circuit according to Supplementary Note 6, wherein a cutoff frequency of the L-th (L is an integer that falls within $2 \leq L \leq N$) input low-pass filter is lower than a cutoff frequency of the (L−1)-th output low-pass filter.

(Supplementary Note 8)

A power supply circuit comprising:

a signal conversion circuit that receives an arbitrary signal and generates one type of analog signal and M (M is an integer equal to or greater than one) types of one-bit digital signals from the arbitrary signal;

a linear amplifier that receives the analog signal, amplifies the received signal, and outputs the amplified signal;

N (N is an integer equal to or larger than two and satisfies $M \leq N$) current detectors that detect a current value of an output signal of a switching amplifier or the linear amplifier;

N pulse signal generators that output a rectangular signal using output signals of the N current detectors;

N switching amplifiers that receive output signals of the N pulse signal generators, amplify the received signals, and output the amplified signals; and N output low-pass filters that receive output signals of the N switching amplifiers, remove high-frequency components from the received signals, and output the resulting signals, wherein:

the first current detector detects an output current of the linear amplifier, the L-th (L is an integer that falls within $2 \leq L \leq N$) current detector detects an output current of the (L−1)-th switching amplifier, the P-th (P is an integer that falls within $1 \leq P \leq M$) pulse signal generator generates the rectangular signal from an output signal of the P-th current detector and the P-th one-bit digital signal, the Q-th (Q is an integer that falls within $M+1 \leq Q \leq N$) pulse signal generator includes a hysteresis comparator, receives the output signal of the P-th current detector, determines whether the signal level is high or low using a predetermined threshold, and outputs the resulting signal as the rectangular signal, the K-th (K is an integer that falls within $1 \leq K \leq N$) switching amplifier receives an output signal of the K-th pulse signal generator, the K-th (K is an integer that falls within $1 \leq K \leq N$) output low-pass filter receives an output signal of the K-th switching amplifier, the hysteresis comparator included in the Q-th pulse signal generator has a function to hold the latest output state and a high-side threshold (Vhigh_Q) and a low-side threshold (Vlow_Q), if the latest output signal is low, the output state changes to high when the voltage of the input signal becomes equal to or greater than Vhigh_Q, and if the latest output signal is high, the output state changes to low when the voltage of the input signal becomes equal to or lower than Vlow_Q, and the output signals of the linear amplifier and the N output low-pass filters are combined and the combined signal is output to an external circuit.

(Supplementary Note 9)

The power supply circuit according to Supplementary Note 8, wherein:

the linear amplifier comprises a high-pass filter at an output of the linear amplifier, and low-frequency components are removed from an output signal of the linear amplifier by the high-pass filter and then the resulting signal is combined with the output signals of the N output low-pass filters.

(Supplementary Note 10)

The power supply circuit according to Supplementary Note 8 or 9, wherein a cutoff frequency of the L-th (L is an integer that falls within $2 \leq L \leq N$) output low-pass filter is lower than a cutoff frequency of the (L−1)-th output low-pass filter.

(Supplementary Note 11)

The power supply circuit according to any one of Supplementary Notes 8 to 10, wherein the P-th (P is an integer that falls within $1 \leq P \leq M$) pulse signal generator comprises:

a first input low-pass filter that receives an output signal of the P-th current detector, removes high-frequency components from the received signal, and outputs the resulting signal;

a second input low-pass filter that receives the P-th one-bit digital signal and outputs a trapezoidal wave or a triangular wave obtained by removing high-frequency components from the input signal;

an analog adder that adds an output signal of the first low-pass filter and an output signal of the second low-pass filter and outputs the resulting signal; and a comparator that outputs a high level signal when an output signal of the analog adder is larger than a predetermined threshold and outputs a low level signal when the output signal of the analog adder is smaller than the predetermined threshold, and an output signal of the comparator is output to the P-th switching amplifier.

(Supplementary Note 12)

The power supply circuit according to any one of Supplementary Notes 8 to 10, wherein:

the P-th (P is an integer that falls within $1 \leq P \leq M$) pulse signal generator comprises:

a first input low-pass filter that receives an output signal of the P-th current detector, removes high-frequency components from the received signal, and outputs the resulting signal;

a second input low-pass filter that receives the P-th one-bit digital signal and outputs a trapezoidal wave or a triangular wave obtained by removing high-frequency components from the input signal;

an inverting amplifier that receives an output signal of the first input filter, inverts the polarity of the received signal, and outputs the resulting signal; and a comparator that receives an output signal of the second low-pass filter and an output signal of the inverting amplifier, outputs a high level signal when the output signal of the second low-pass filter is larger than the output signal of the inverting amplifier, and outputs a low level signal when the output signal of the second low-pass filter is smaller than the output signal of the inverting amplifier, and an output signal of the comparator is output to the P-th switching amplifier.

(Supplementary Note 13)

The power supply circuit according to any one of Supplementary Notes 8 to 12, wherein:

an input low-pass filter is provided between the Q-th (K is an integer that falls within M+1≤Q≤N, a plurality of values may be selected as K) current detector and the Q-th pulse signal generator, and a signal obtained by removing high-frequency components from an output signal of the Q-th current detector is output to the Q-th pulse signal generator.

(Supplementary Note 14)

A high-frequency power amplifier comprising:

a power amplifier that amplifies a high-frequency modulation signal used for a desired information communication; and the power supply circuit according to Supplementary Notes 1 to 13 that receives an amplitude component of the high-frequency modulation signal as an input signal, wherein an output signal of the power supply circuit is used as a power supply of the power amplifier.

While the present invention has been described with reference to the exemplary embodiments, the present invention is not limited to the above exemplary embodiments. Various changes that can be understood by those skilled in the art can be made to the configurations and the details of the present invention within the scope of the present invention.

REFERENCE SIGNS LIST

10 POWER SUPPLY CIRCUIT
11 LINEAR AMPLIFIER
12 FIRST SWITCHING AMPLIFIER
13 SECOND SWITCHING AMPLIFIER
14 POWER SUPPLY UNIT
101 HIGH-FREQUENCY MODULATION SIGNAL INPUT TERMINAL
102 AMPLITUDE SIGNAL INPUT TERMINAL
103 POWER SUPPLY CIRCUIT
104 HIGH-FREQUENCY POWER AMPLIFIER
105 HIGH-FREQUENCY MODULATION SIGNAL OUTPUT TERMINAL
106 LINEAR AMPLIFIER
107 SUBTRACTOR
108 CURRENT DETECTION RESISTOR
109 HYSTERESIS COMPARATOR
110 SWITCHING AMPLIFIER
110 LINEAR AMPLIFIER
111 INDUCTOR
112 POWER SUPPLY TERMINAL
201, 301, 401 POWER SUPPLY CIRCUIT
202, 302, 402 SIGNAL INPUT TERMINAL
203, 303, 405 LINEAR AMPLIFIER
204, 207, 304-1-304-n, 407-1-407-n CURRENT DETECTOR
205, 210, 306-1-306-n, 702-q HYSTERESIS COMPARATOR
206, 211, 307-1-307-n, 410-1-410-n SWITCHING AMPLIFIER
206a BUFFER CIRCUIT
206b INVERTER CIRCUIT
206c POWER SUPPLY
208, 209, 212, 411-1-411-n LOW-PASS FILTER
213, 309, 412 SIGNAL OUTPUT TERMINAL
214 HIGH-FREQUENCY MODULATION SIGNAL INPUT TERMINAL
215 HIGH-FREQUENCY POWER AMPLIFIER
216 HIGH-FREQUENCY MODULATION SIGNAL OUTPUT TERMINAL
305-1-305-n INPUT FILTER
308-1-308-n OUTPUT FILTER
403 SIGNAL CONVERSION CIRCUIT
404 ANALOG SIGNAL TERMINAL
406 HIGH-PASS FILTER
408-1-408-m DIGITAL SIGNAL TERMINAL
409-1-409-n PULSE SIGNAL GENERATOR
501-p, 502-p, 601-p, 602-p, 701-q INPUT FILTER
503-p ANALOG ADDER
504-p, 604-p COMPARATOR
603-p INVERTING AMPLIFIER

The invention claimed is:

1. A power supply circuit comprising:
a linear amplification unit that generates a linear amplification signal based on an input signal;
a first switching amplification unit that generates a first switching amplification signal of a first frequency band by detecting an output signal from the linear amplification unit;
a second switching amplification unit that generates a second switching amplification signal of a second frequency band by detecting an output signal from the first switching amplification unit; and
a power supply unit that supplies a combined signal in which the linear amplification signal and the first and second switching amplification signals are combined to an external circuit as a power supply.

2. The power supply circuit according to claim 1, wherein:
the linear amplification unit linearly amplifies the input signal and generates the linear amplification signal,
the first switching amplification unit comprises:
a first current detector that detects a current of the linear amplification signal and generates a first detection signal according to the current;
a first hysteresis comparator that determines the level of the first detection signal and generates a first determination signal according to the level;
a first switching amplifier that switching-amplifies the first determination signal; and
a first output low-pass filter that removes high-frequency components from a signal obtained by amplifying the first determination signal and generates the first switching amplification signal of the first frequency band, and
the second switching amplification unit comprises:
a second current detector that detects a current of a signal obtained by amplifying the first determination signal and generates a second detection signal according to the current;

a second hysteresis comparator that determines the level of the second detection signal and generates a second determination signal according to the level;
a second switching amplifier that switching-amplifies the second determination signal; and
a second output low-pass filter that removes high-frequency components from a signal obtained by amplifying the second determination signal and generates the second switching amplification signal of the second frequency band.

3. The power supply circuit according to claim 2, wherein a cutoff frequency of the second output low-pass filter is lower than a cutoff frequency of the first output low-pass filter.

4. The power supply circuit according to claim 2, wherein:
the first switching amplification unit comprises a first input low-pass filter that removes high-frequency components from the first detection signal, and
the first hysteresis comparator determines the level of a signal obtained by removing high-frequency components from the first detection signal and generates the first determination signal according to the level.

5. The power supply circuit according to claim 2, wherein:
the second switching amplification unit comprises a second input low-pass filter that removes high-frequency components from the second detection signal, and
the second hysteresis comparator determines the level of a signal obtained by removing high-frequency components from the second detection signal and generates the second determination signal according to the level.

6. The power supply circuit according to claim 5, wherein a cutoff frequency of the second input low-pass filter is lower than a cutoff frequency of the first output low-pass filter.

7. A power supply circuit comprising:
a linear amplification unit that generates a linear amplification signal based on an input signal;
a first switching amplification unit that generates a first switching amplification signal of a first frequency band based on the linear amplification signal;
a second switching amplification unit that generates a second switching amplification signal of a second frequency band based on the first switching amplification signal;
a power supply unit that supplies a combined signal in which the linear amplification signal and the first and second switching amplification signals are combined to an external circuit as a power supply; and
a third switching amplification unit that generates a third switching amplification signal of a third frequency band based on the second switching amplification signal,
wherein the power supply unit combines the linear amplification signal and the first, the second, and the third switching amplification signals.

8. A power supply circuit comprising:
a linear amplification unit that generates a linear amplification signal based on an input signal;
a first switching amplification unit that generates a first switching amplification signal of a first frequency band based on the linear amplification signal;
a second switching amplification unit that generates a second switching amplification signal of a second frequency band based on the first switching amplification signal;
a power supply unit that supplies a combined signal in which the linear amplification signal and the first and second switching amplification signals are combined to an external circuit as a power supply; and
a signal conversion circuit that generates an analog signal and first and second one-bit digital signals based on the input signal, wherein:
the linear amplification unit linearly amplifies the analog signal and generates the linear amplification signal,
the first switching amplification unit comprises:
a first current detector that detects a current of the linear amplification signal and generates a first detection signal according to the current;
a first pulse signal generator that generates a first pulse signal based on the first detection signal and the first one-bit digital signal;
a first switching amplifier that switching-amplifies the first pulse signal; and
a first output low-pass filter that removes high-frequency components from a signal obtained by amplifying the first pulse signal and generates the first switching amplification signal of the first frequency band, and
the second switching amplification unit comprises:
a second current detector that detects a current of a signal obtained by amplifying the first pulse signal and generates a second detection signal according to the current;
a second pulse signal generator that generates a second pulse signal based on the second detection signal and the second one-bit digital signal;
a second switching amplifier that switching-amplifies the second pulse signal; and
a second output low-pass filter that removes high-frequency components from a signal obtained by amplifying the second pulse signal and generates the second switching amplification signal of the second frequency band.

9. A high-frequency power amplification circuit comprising:
a high-frequency power amplifier that amplifies a high-frequency modulation signal that is input;
a linear amplification unit that generates a linear amplification signal based on an amplitude signal which is an amplitude component of the high-frequency modulation signal;
a first switching amplification unit that generates a first switching amplification signal of a first frequency band by detecting an output signal from the linear amplification unit;
a second switching amplification unit that generates a second switching amplification signal of a second frequency band by detecting an output signal from the first switching amplification unit; and
a power supply unit that supplies a combined signal obtained by combining the linear amplification signal and the first and second switching amplification signals to the high-frequency power amplifier as a power supply.

10. A power supply control method in a power supply circuit, wherein:
the power supply circuit generates a linear amplification signal based on an input signal,
the power supply circuit generates a first switching amplification signal of a first frequency band by detecting an output signal from the linear amplification unit, the power supply circuit generates a second switching amplification signal of a second frequency band by detecting an output signal from the first switching amplification unit; and the power supply circuit supplies a combined signal obtained by combining the linear amplification signal and the first and second switching amplification signals to an external circuit as a power supply.

11. A power supply circuit comprising:

a linear amplification means for generating a linear amplification signal based on an input signal;

a first switching amplification means for generating a first switching amplification signal of a first frequency band by detecting an output signal from the linear amplification unit;

a second switching amplification means for generating a second switching amplification signal of a second frequency band by detecting an output signal from the first switching amplification unit; and a power supply means for supplying a combined signal in which the linear amplification signal and the first and second switching amplification signals are combined to an external circuit as a power supply.

12. A high-frequency power amplification circuit comprising:

a high-frequency power amplifier that amplifies a high-frequency modulation signal that is input;

a linear amplification means for generating a linear amplification signal based on an amplitude signal which is an amplitude component of the high-frequency modulation signal;

a first switching amplification means for generating a first switching amplification signal of a first frequency band by detecting an output signal from the linear amplification unit;

a second switching amplification means for generating a second switching amplification signal of a second frequency band by detecting an output signal from the first switching amplification unit; and a power supply means for supplying a combined signal obtained by combining the linear amplification signal and the first and second switching amplification signals to the high-frequency power amplifier as a power supply.

* * * * *